(12) United States Patent
Hsu et al.

(10) Patent No.: US 6,556,477 B2
(45) Date of Patent: Apr. 29, 2003

(54) INTEGRATED CHIP HAVING SRAM, DRAM AND FLASH MEMORY AND METHOD FOR FABRICATING THE SAME

(75) Inventors: Louis L. Hsu, Fishkill, NY (US); Carl Radens, Langrangeville, NY (US); Li-Kong Wang, Montvale, NJ (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/861,788

(22) Filed: May 21, 2001

(65) Prior Publication Data

US 2002/0172074 A1 Nov. 21, 2002

(51) Int. Cl.[7] ............................................. G11C 11/34
(52) U.S. Cl. ............................. 365/185.08; 365/185.24
(58) Field of Search ........................ 365/185.08, 185.24

(56) References Cited

U.S. PATENT DOCUMENTS

| | | | |
|---|---|---|---|
| 5,799,200 A | 8/1998 | Brant et al. | 395/750.08 |
| 5,841,694 A | 11/1998 | Wong | 365/185.05 |
| 5,867,425 A | 2/1999 | Wong | 365/185.08 |
| 5,963,476 A | 10/1999 | Hung et al. | 365/185.22 |
| 5,966,727 A | 10/1999 | Nishino | 711/127 |
| 5,998,826 A | 12/1999 | Hung et al. | 257/315 |
| 6,026,028 A | 2/2000 | Lin et al. | 365/185.33 |
| 6,043,123 A | 3/2000 | Wang et al. | 438/258 |
| 6,052,305 A | 4/2000 | Yang et al. | 365/185.18 |
| 6,141,242 A * | 10/2000 | Hsu et al. | 365/182 |
| 6,424,011 B1 * | 7/2002 | Assaderaghi et al. | 257/350 |

OTHER PUBLICATIONS

"A Fully Planarized 0.25μm CMOS Technology for 256Mbit DRAM and Beyond", Bronner, et al. 1995 pp. 15–16.
"A 0.6μm² 256Mb Trench DRAM Cell With Self–Aligned BuriEd STrap (BEST)", Nesbit, et al. 1993 pp. 627–630.
"Extending Trench DRAM Technology to 0.15μm Groundrule and Beyond", Rupp, et al. 1999 pp. 33–36.

* cited by examiner

Primary Examiner—M. Tran
(74) Attorney, Agent, or Firm—Dilworth & Barrese, LLP

(57) ABSTRACT

A semiconductor memory system fabricated on one substrate is presented including an SRAM device, a DRAM device and a Flash memory device. In one embodiment the SRAM device is a high-resistive load SRAM device. In another embodiment the DRAM device is a deep trench DRAM device. A method is also presented for fabricating the memory system on one substrate having the SRAM device, the DRAM device and the Flash memory device.

13 Claims, 9 Drawing Sheets

INTEGRATED CHIP HAVING SRAM, DRAM AND FLASH MEMORY AND METHOD FOR FABRICATING THE SAME

FIELD OF THE INVENTION

The invention relates to the field of integrated circuit (IC) design. Specifically, it relates to an integrated chip having a Static Random Access Memory (SRAM) device, a Dynamic Random Access Memory (DRAM) device and a Flash memory device and a method for fabricating the same. More specifically, it relates to an integrated chip in which the SRAM device is a high resistive load SRAM device, the DRAM device is a deep trench DRAM device, having a deep trench capacitor, and the Flash memory device is a conventional stack-gate Flash memory device.

BACKGROUND OF THE INVENTION

Many applications exist in which a variety of memory devices including SRAM, DRAM and Flash memory devices are used. These are typically integrated into multi-chip packages. Each memory device has its own characteristics, making it suitable for certain types of storage. An SRAM device provides high-speed performance. A DRAM device is more compact than an SRAM device, thereby providing a higher storage capacity. Both SRAM and DRAM devices are volatile memories. A DRAM device requires frequent refresh operations for maintaining storage of valid data when power is down. Refresh operations consume power and interrupt availability of data.

A Flash memory device is nonvolatile. However, read, write and erase operations are slow for a Flash memory device relative to DRAM and SRAM devices. Further, high power is required for erase and write operations (with an erase operation typically being required prior to a write operation) for a Flash memory device relative to DRAM and SRAM devices. Furthermore, a Flash memory device lifetime is limited, typically to a range of 100,000 program/erase cycles.

Each memory device is used in accordance with the advantages and disadvantages inherent to its characteristics. Typically an SRAM device is used as a high-speed L1 cache, a DRAM device is used as a temporary pad or integrated into the system for use as an L2 cache, and a Flash memory device is used for preserving data when power is interrupted. A DRAM device is used as a shadow of a Flash memory device such as for storing data copied from the Flash memory device when power is on to allow high-speed access and to allow updating of application codes stored by the Flash memory device without compromising system performance. Furthermore, a DRAM device is typically used to store volatile data such as system stack, scratch pad variables and frame buffers, etc. Using a DRAM device as a shadow of a Flash memory device extends the lifetime of the Flash memory device since less write/erase operations are performed by the Flash memory device over a given period of time.

There are disadvantages to providing SRAM, DRAM and Flash memory devices in a multi-chip package, as compared to integrating one or more of the memory devices onto a single chip. One disadvantage is that multi-chip packages generally incur higher fabrication costs than a single-chip with an embedded DRAM device. One example is to build DRAM and Flash memory on the same chip. Fabrication cost can be decreased by using a DRAM BIST (Built-In Self-Test) methodology, in which a DRAM macro embedded with a Flash memory macro can be tested at a high speed. Using DRAM BIST methodology, addresses of faulted elements of DRAM devices are recorded by using flash memory which provides a lower cost solution than stand-alone DRAM chips employing fuse banks for redundancy design.

Another disadvantage to multi-chip packages is a degradation of system performance. For example, stand-alone chips are generally limited to a narrow bandwidth, with the I/O datalines being used alternately for input and output. By integrating various memory macros onto one chip, wider internal data bandwidth with a shorter lengthen for communication can be provided. Furthermore, using an embedded DRAM (eDRAM), in which a DRAM macro is integrated onto a CPU chip, a relatively wide bandwidth can be used for two-way communication between the eDRAM and the CPU, as well as the eDRAM and the Flash memory device, significantly improving communication, and thus performance. An eDRAM used as an L2 cache further boosts the system performance.

Integration of memory devices into one chip has been proposed. For example, in U.S. Pat. No. 6,141,242 issued to Hsu et al., entitled "LOW COST MIXED MEMORY INTEGRATION WITH SUBSTANTIALLY COPLANAR GATE SURFACES", teaches a fabrication process for integrating an SRAM structure having a thin-film transistor, a DRAM structure having a stack capacitor and a Flash memory structure having a three piece floating gate structure onto a single chip. The fabrication process is restricted to use with a specific type of memory device, i.e., a Flash memory structure having a three-piece floating gate structure, whose use is limited.

SUMMARY

An aspect of the present invention is to provide a semiconductor chip including DRAM, SRAM and Flash memory devices fabricated on the same substrate, wherein the memory devices are widely known, and are highly reliable to overcome the disadvantages of the prior art.

Another aspect of the present invention is to provide a semiconductor chip including highly reliable and widely known memory devices including DRAM, SRAM and Flash Memory devices fabricated on the same substrate together with a CPU core Another aspect of the present invention is to provide an integrated chip having three types of memory devices including a deep-trench DRAM device.

Still another aspect of the present invention is to provide an integrated chip having three types of memory devices including a high density, high resistive load SRAM device.

Another aspect of the present invention is to provide an integrated chip having three types of memory devices including a conventional stack-gate Flash memory.

Also, another aspect of the present invention is to provide a method for fabricating an integrated chip having three types of memory devices including a deep-trench DRAM, a high resistive load SRAM and a conventional stack-gate Flash memory.

Finally, another aspect of the present invention, is to provide a low-cost method for fabricating an integrated chip having three types of memory devices including DRAM, SRAM and Flash memory devices, in which the three memory devices are fabricated simultaneously together with support circuits.

Accordingly, in an embodiment of the present invention, a semiconductor memory device fabricated on one substrate is presented having an NVRAM device, a DRAM device, and an SRAM device having a high resistive load element. In another embodiment the DRAM device is a deep trench DRAM device. In another embodiment the DRAM device is a stack capacitor DRAM device.

In another embodiment of the present invention, a method is presented for fabricating a semiconductor memory device including the steps of providing a single substrate, fabricating an NVRAM, DRAM, and SRAM device on a single substrate, wherein the SRAM device has a high resistive load element. In another embodiment the step of fabricating the DRAM device includes the step of fabricating a deep trench DRAM device. In another embodiment the step of fabricating a DRAM device includes the step of fabricating a stack capacitor DRAM device.

DETAILED DESCRIPTION OF THE INVENTION

Figure 1:
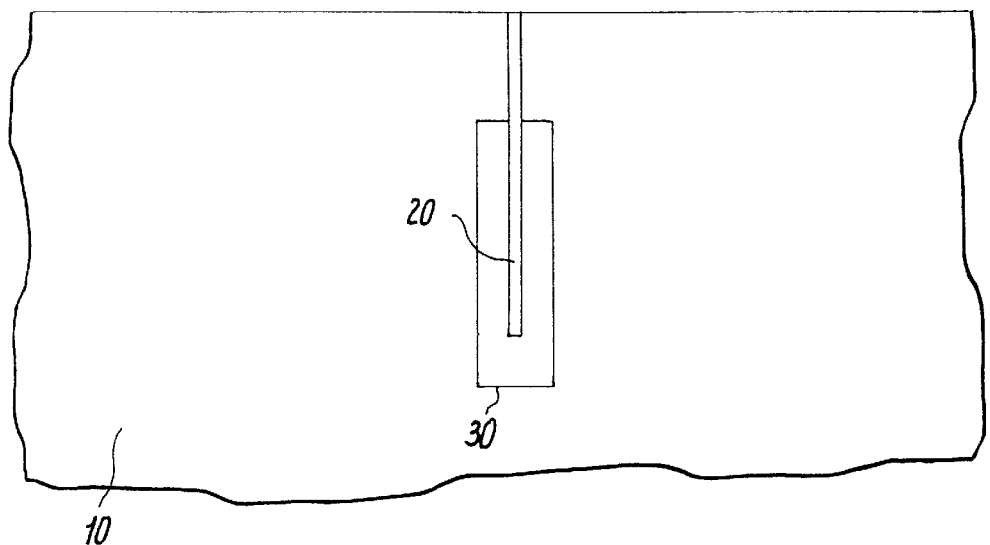
FIGS. 1–15 are cross sectional views illustrating a preferred process for fabricating an integrated chip having SRAM, DRAM and Flash memory devices according to the present invention.

Referring to FIGS. 1–15 in which like reference numerals refer to like elements, a method is shown for fabricating an integrated chip having SRAM, DRAM and Flash memory devices. It is appreciated that the terms SRAM device, DRAM device and Flash memory device refer to an SRAM cell, a DRAM cell and a Flash memory cell, respectively. It is further appreciated that the integrated chip may include a plurality of SRAM, DRAM and Flash memory cells and that the plurality of SRAM, DRAM and Flash memory cells may be configured for forming respective arrays. In the preferred embodiment, the SRAM device is a high resistive load SRAM device, preferably a 4T high resistive load (high-R) SRAM device. The preferred SRAM device is fabricated by forming a resistor of a material having a high resistivity value, such as refractory metalsilicon-nitrogen, and forming the resistor in a via. The high-R SRAM device is a high density device having a high resistivity and being compact. The high resistive SRAM device is significantly smaller than a conventional 6T SRAM device. Furthermore, the high resistive SRAM device is typically manufactured at a lower cost and is more reliable than other types of SRAM devices. In another embodiment a conventional SRAM device may be used, as it is integrated in the same way as typical support circuits, such as microprocessors.

The integrated chip preferably includes a DRAM macro including a plurality of DRAM devices, each having a deep trench capacitor. The deep trench DRAM device is widely known in the industry. It provides high cell storage and planar topography. Preferably the Flash memory device is a conventional stack-gate Flash memory device that is also widely known and provides high reliability. In a preferred embodiment, a single (or unified) DC voltage generator system (not shown) is provided on the integrated chip for supplying power to the SRAM, DRAM, processor and Flash memory devices.

With reference to FIG. 1, a substrate 10, preferably a single crystal p-substrate, such as a silicon substrate or an SOI substrate, is shown in which a DRAM trench capacitor 20, buried plate 30, such as an n+ buried plate, and buried strap (not shown) are formed therein. Since the deep trench DRAM is well known in the art, a simplified drawing set is used here.

The deep trench capacitor 20 is preferably formed as described in T. Rupp et al., "Extending Trench DRAM Technology to 0.15 μm Groundrule and Beyond", IEDM Technical Digest, IEEE, 1999, pages 33–36. A trench 22 is formed in the substrate 10 using conventional photolithography and reactive ion etching (RIE) techniques to a preferred depth of 6–10 μm.

The n+ buried plate 30 is formed using a thermal diffusion of Arsenic (or Phosphorous) from an As (or P)-doped glass. A vertical isolation collar (not shown) is formed using dry plasma etching, low-pressure chemical vapor deposition (LPCVD) and RIE techniques. After doping, the glass material is stripped, and a thin node capacitor dielectric is formed by thermal oxidation or nitride CVD deposition to a final thickness preferably of 2.5 nm–10 nm. The trench 22 is then filled with a LPCVD poly-silicon, forming the deep-trench capacitor 20. The buried strap, which connects a capacitor node of the capacitor to a junction of a transfer device, is formed using a dry etch recess technique to remove a portion of the collar, and is then filled with LPCVD poly-silicon at the surface of the substrate 10.

Figure 2:
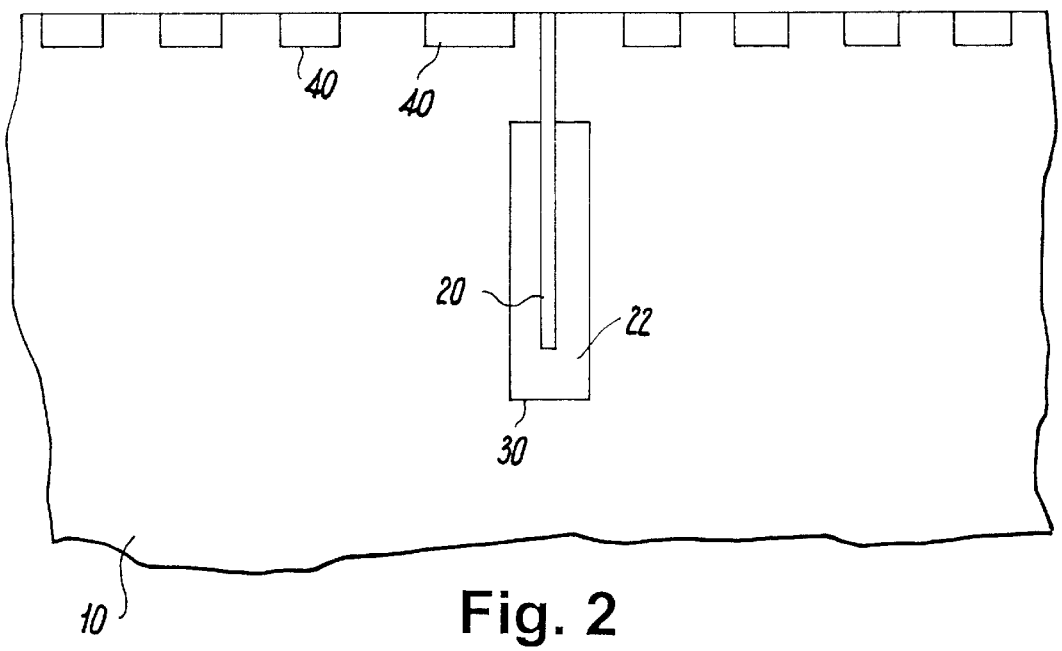

FIG. 2 shows a plurality of shallow trench isolation (STI) regions 40 formed at the surface of substrate 10 using conventional methods to a preferred depth of 100 nm–500 nm. The STI regions 40 electrically isolate the devices.

Figure 3:
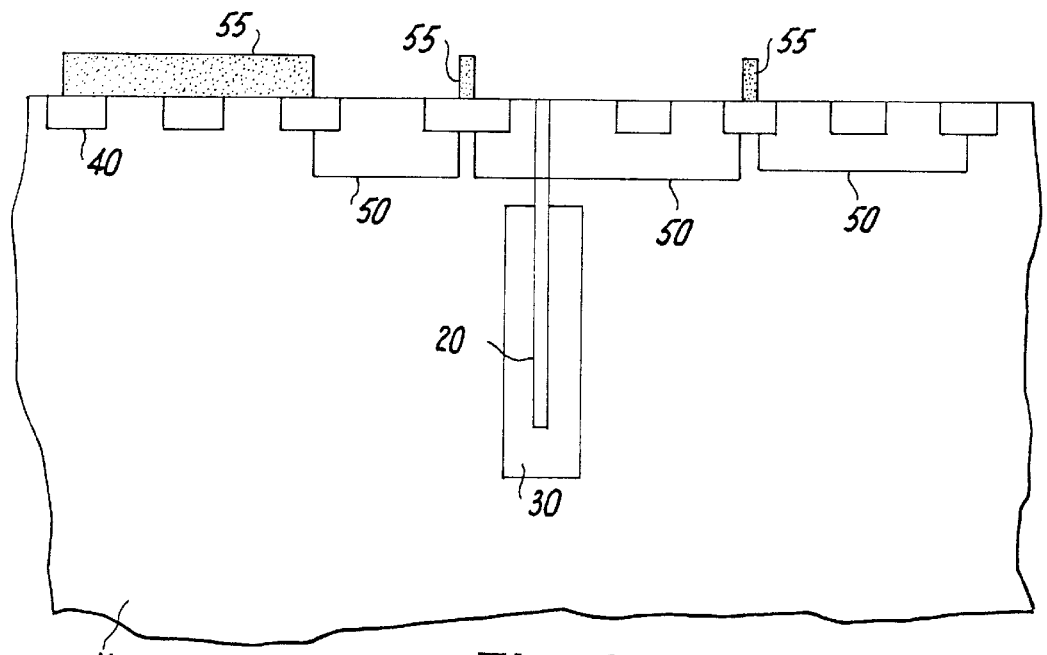
Figure 4:
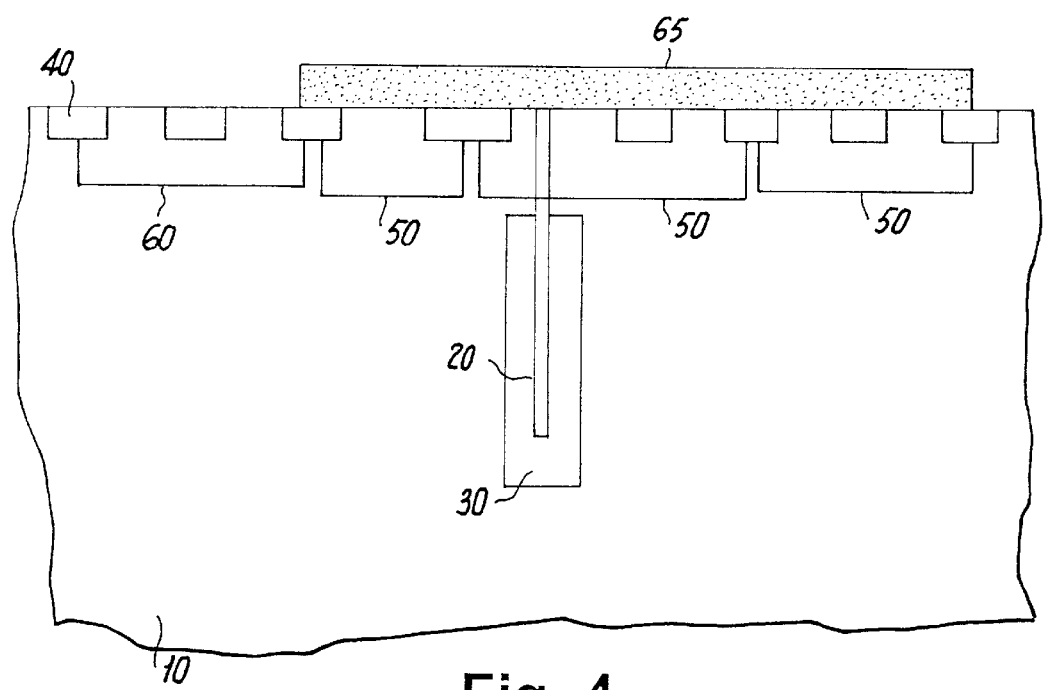
Figure 5:
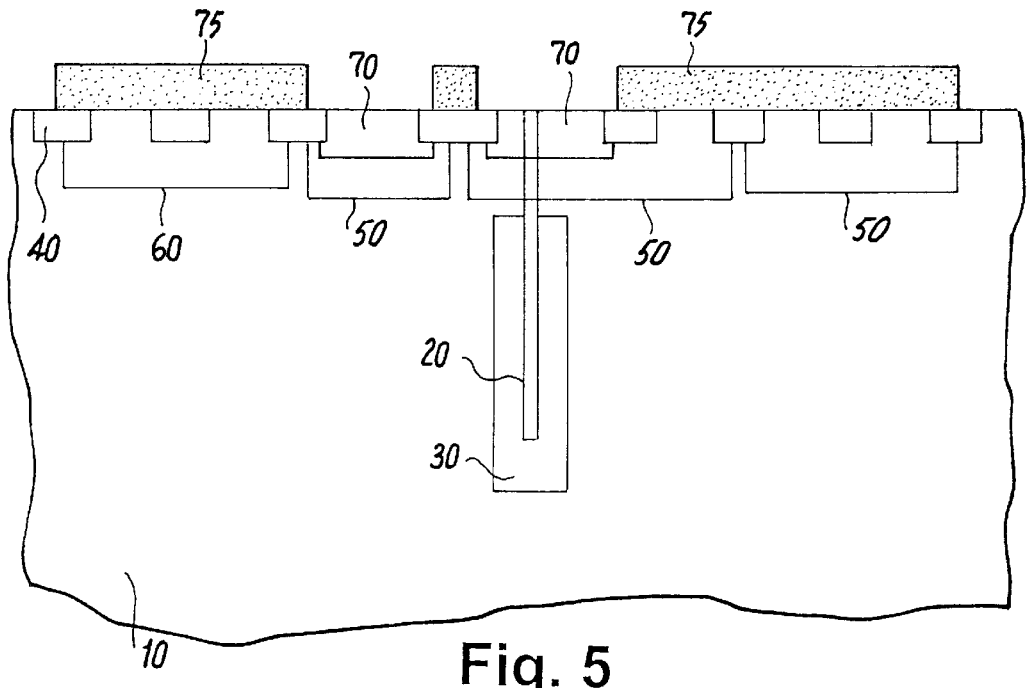
Figure 6:
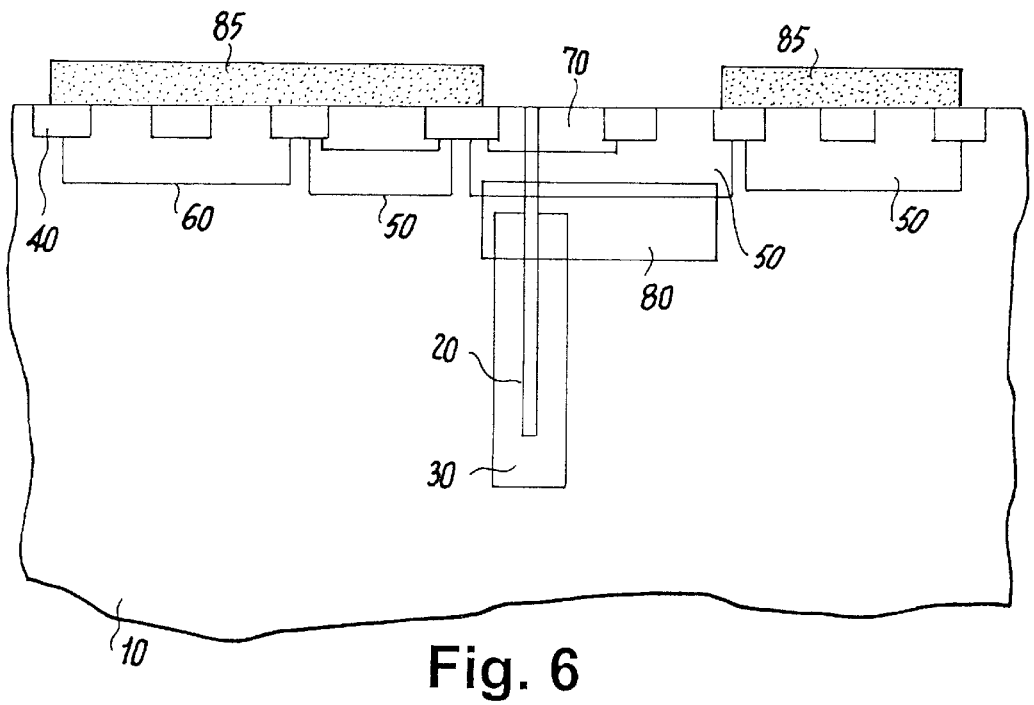

FIGS. 3–6 show the formation of localized n or p well regions as is known in the art. In FIG. 3, n-wells 50 are formed using mask 55. In FIG. 4, p-wells 60 for support devices are formed using mask 65. In FIG. 5, p-wells 70 for an array of the DRAM and the Flash memory, respectively, are formed using mask 75. In FIG. 6, n-buried diffusion 80 is formed using mask 85. The n-buried diffusion 80 provides contact between the deep trench capacitor 20 and the p-well 70 of the DRAM array via an associated n-well 50.

Figure 7:
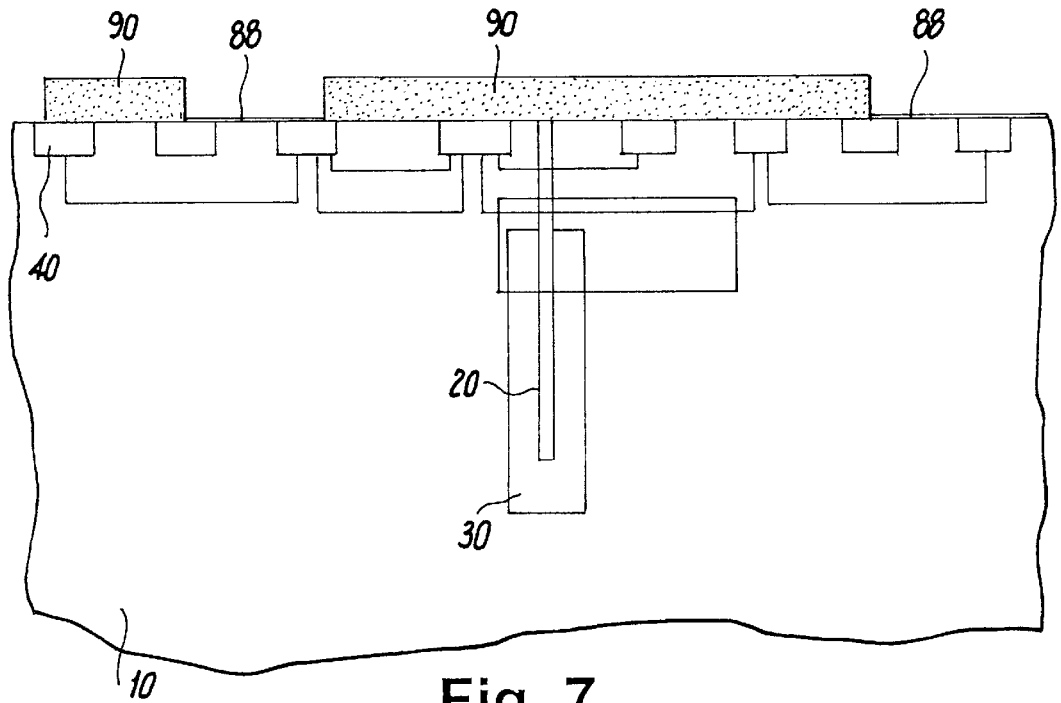
Figure 8:
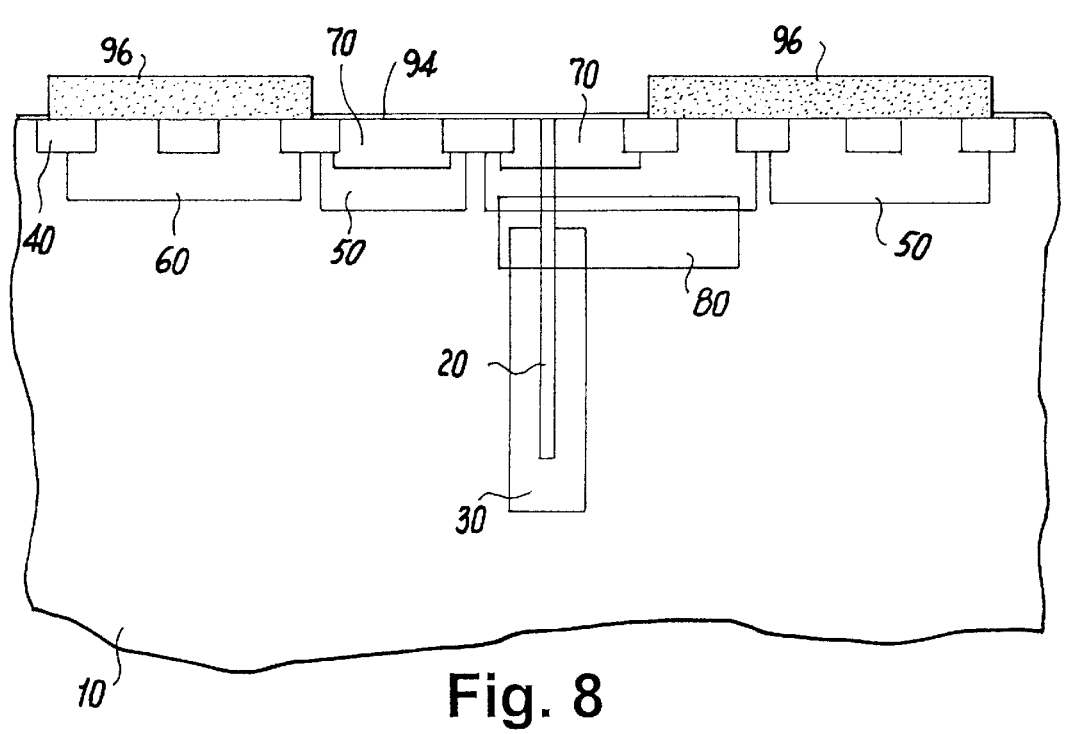

FIGS. 7–10 show the formation of gate dielectric layers and gate conductors for FETs used in the SRAM, DRAM and Flash memory devices and for support devices, such as a transistor, a memory cell, a CPU core (for example, a microprocessor, a controller, a CPU, etc.), as will be described. FIG. 7 shows the formation of a thin gate dielectric layer 88 on the substrate using mask 90. FIG. 8 shows the formation of a thicker gate dielectric layer 94 on the substrate using mask 96. The thin gate dielectric layer 88, to be used for non-array devices, and the thicker gate dielectric layer 94, to be used for array devices, are preferably formed by thermal oxidation.

Figure 9:
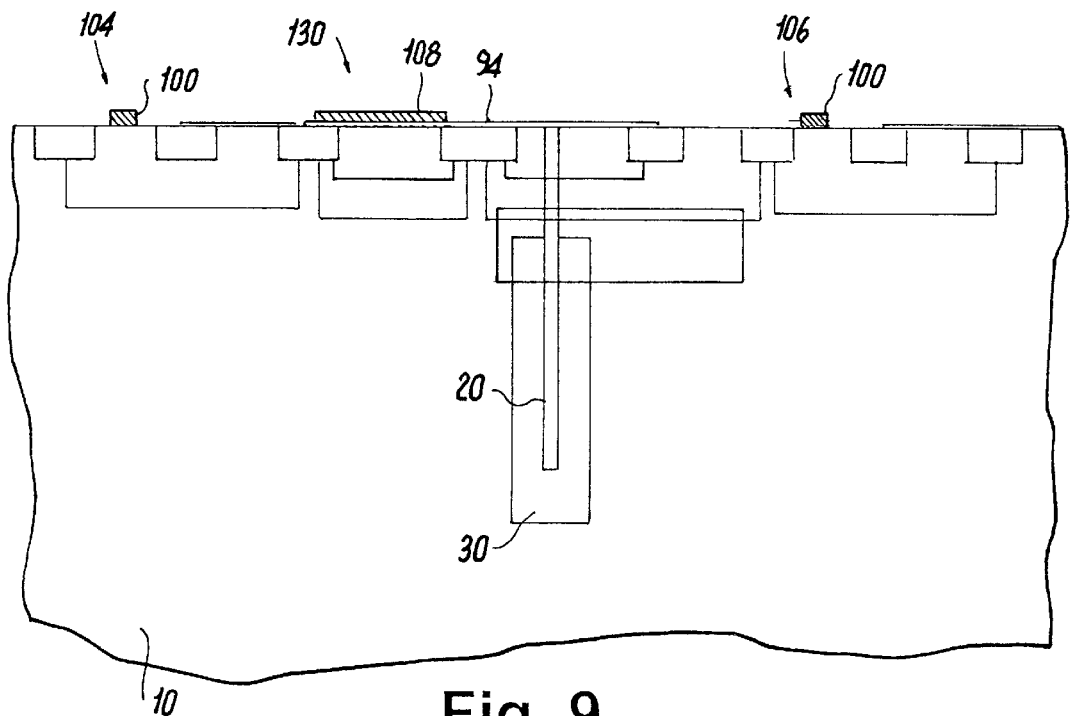

FIG. 9 shows the deposition of a thick gate dielectric (oxide) material 100 (preferably in the range of 20 nm to 50 nm) on the substrate 10 for forming n channel FET support devices with gate 104, and p channel FET support devices with gate 106. The deposition of a first Flash nFET gate conductor material 108 is shown on a portion of the dielectric layer for array devices 94.

Figure 10:
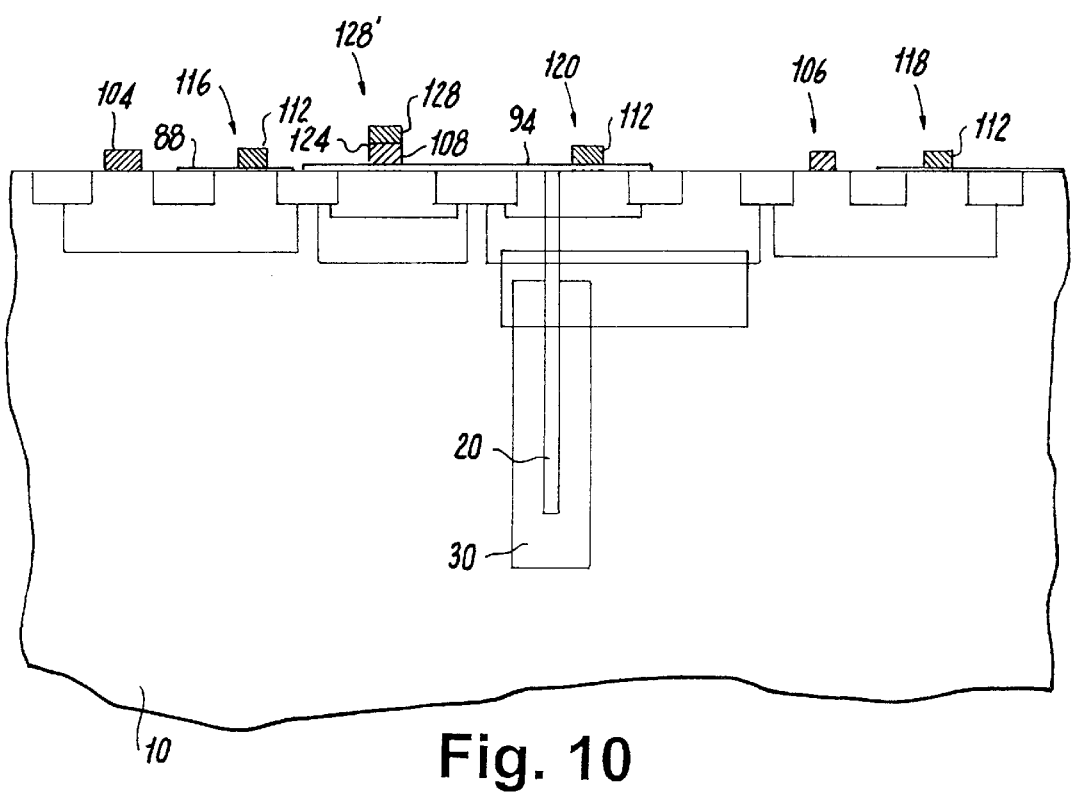

FIG. 10 shows the deposition of a gate material 112 on a portion of the thin dielectric layer 88 to form a thin gate oxide nFET as transfer and pull down devices of SRAM 116, on another portion of the thin dielectric layer 88 to form a thin oxide pFET support device 118, and on another portion of the thin dielectric layer 88 to form a DRAM nFET gate 120. The first gate conductor material 108 of the flash memory is partially patterned to form isolated floating gate units. A thin oxide layer 124 and then a second gate conductor material 128 for the flash memory are deposited on top of the etched floating gate conductor material 108. The second gate conductor material 128 (also know as the control gate), the thin oxide layer 124 and the partially patterned floating gate conductor material 108 are patterned and etched to form a Flash memory cell in a self-aligned manner.

In the next stage of fabrication, sidewall spacers, source/drain ion implantation (I/I) regions, and salicide formation are done for each FET (details are not shown), as is well known in the art. Spacer thickness is preferably in the range of 5 nm–50 nm. Before and after spacer formation, the source/drain regions are implanted for each FET to provide lightly doped regions directly adjacent to a transistor channel, as is known in the art.

Figure 11:
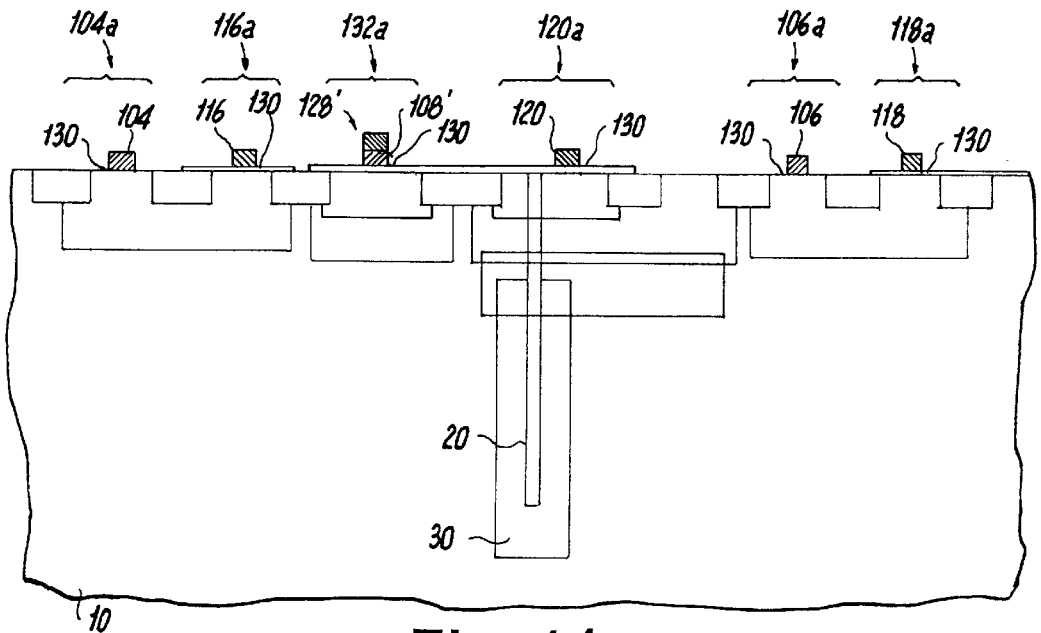

Referring to FIG. 11, a salicide source and drain junction 130 for each FET is shown. The salicide is preferably formed by a thermal reaction of cobalt with the substrate 10. The region of each FET, i.e., the gate(s) and source and drain regions of each FET is shown, including thick nFET support device 104a, thin nFET SRAM 116a, Flash nFET 130a, DRAM nFET 120a, thick pFET support device 106a, and thin pFET support device 118a. The source/drain ion inclination regions of DRAM nFET 120a are in contact with the deep trench capacitor via the p-well region 70 which is in contact with the deep trench capacitor via the associated n-well region 50 and the n-band region 80, as described above.

The thick oxide support devices 104a, 106a are suitable for high voltage I/O and Flash memory programming devices. The thin oxide devices SRAM 116a and support device 118a are suitable for high performance operation. Preferably, the gate material 112 of the thin oxide devices SRAM 116a and support device 118a has a thickness in the range of 2 nm–5 nm and the thick gate oxide 100 of the thick gate oxide support devices 104a, 106a has a thickness in the range of 5 nm–10 nm. The oxide thickness is set in the different devices by lithographic masking and shallow ion implantation of nitrogen in selected regions of the substrate 10, and/or selective remove and regrowth of the gate oxides in selected regions of the substrate 10.

Figure 12:
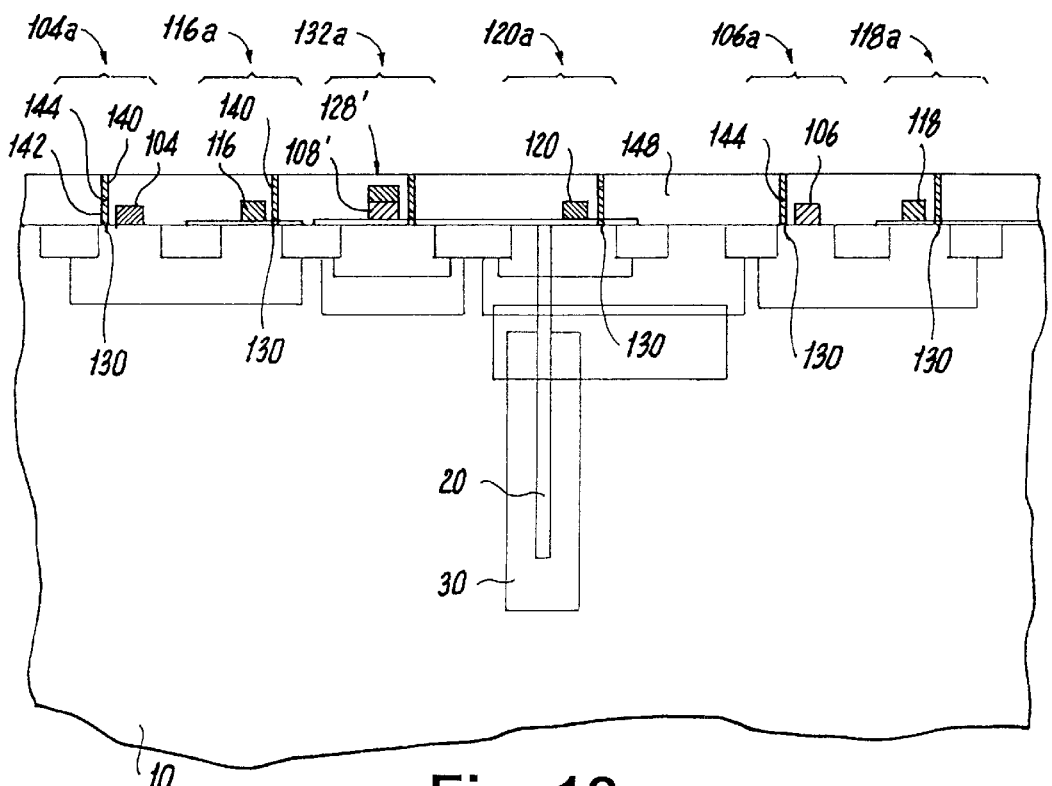

Referring to FIG. 12, contacts 140 are formed by providing holes 142 filled with contact studs 144. The contact studs 144 are formed using a PVD of thin barrier layers such as titanium, or titanium nitride, and CVD tungsten. The material is planarized by a chem-mech polish (or CMP). The contacts 140 are formed using standard processing, such as doped glass interlevel dielectric deposition and planarization, contact lithography, dry etch patterning, metal deposition, and planarization techniques. The contacts 140 connect with the drain/source regions by contacting the source drain junctions 130. The source drain junction 130 of each of the FETs is contacted by one of the contacts 140. A first insulating material 148, such as a dielectric is deposited onto the substrate 10.

Figure 13:
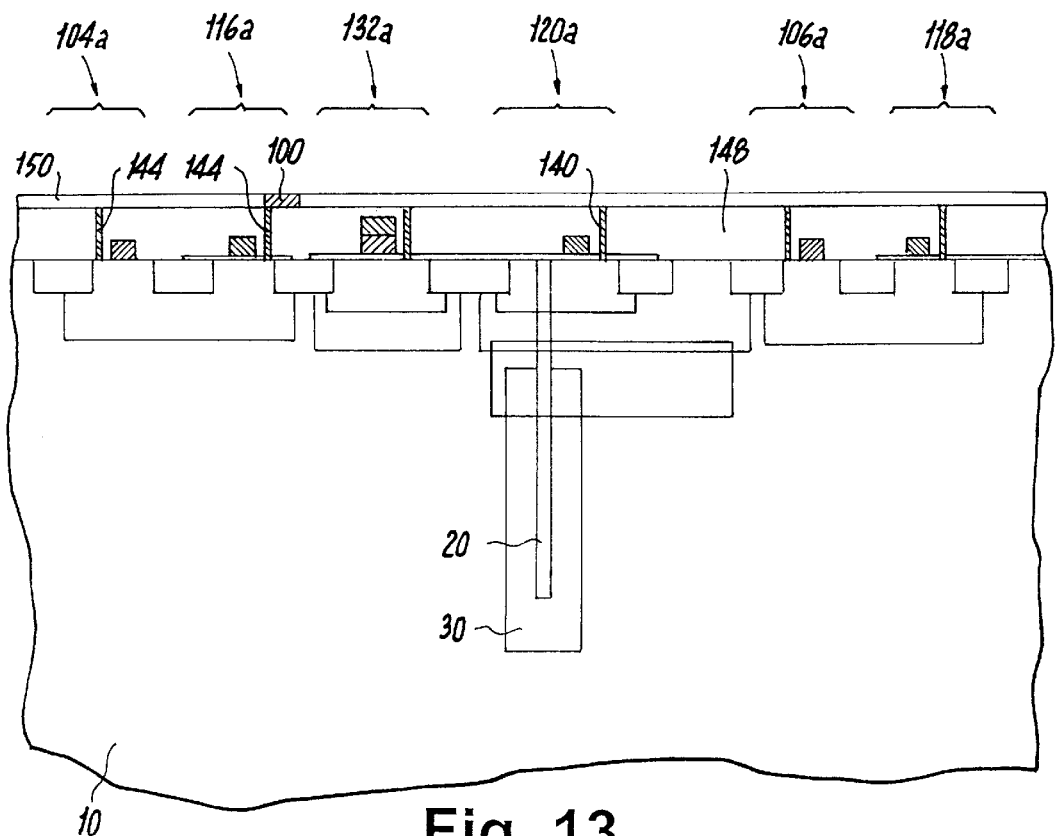

Referring to FIG. 13, the SRAM 116a is provided with a resistive element 100 for providing a high resistive load for each SRAM cell, preferably, formed by deposition and planarization of a resistive material, such as a TaSiN plug. A second insulating material 154, i.e. a dielectric such as an oxide, is deposited onto the first insulating material 148. The insulating material 154 is etched. A material having a high resistivity is deposited into the etched area and polished, such as by CMP, to form the load element 100.

Figure 14:
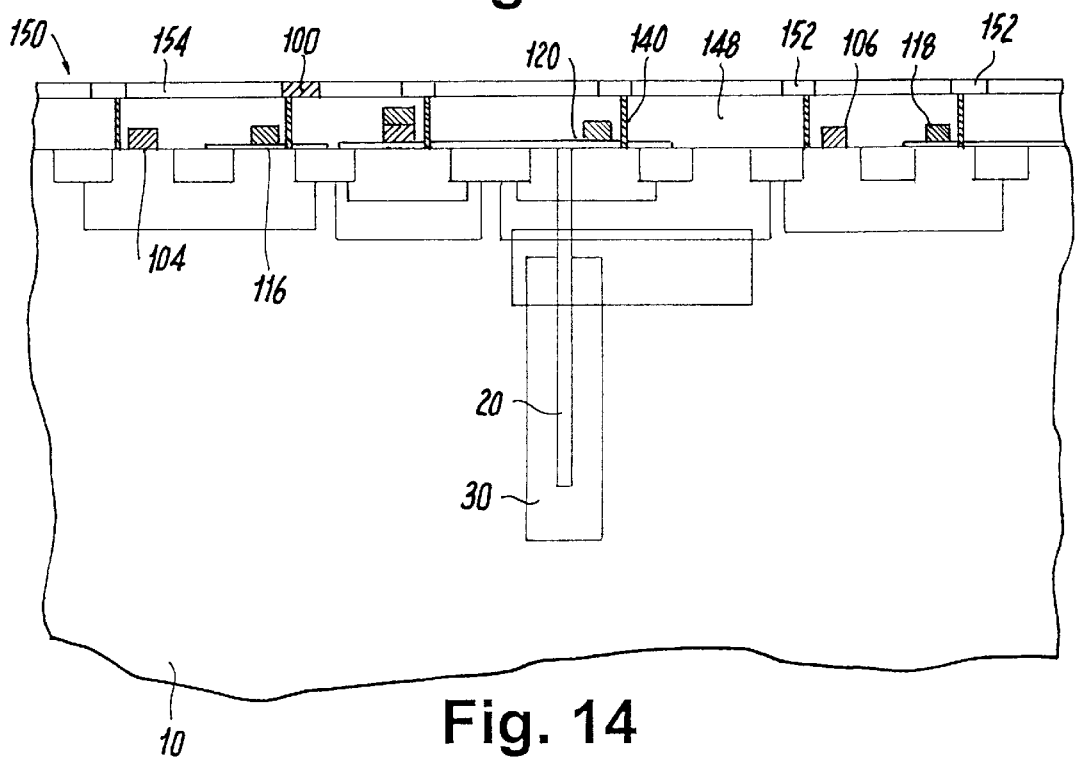

Referring to FIG. 14, the second insulating material 154 is etched at each position adjacent to one of the contacts 140. A conductive material, i.e. a metal, is deposited into each of the etched portions for making contact with the contacts 140, and polished, such as by CMP, to form local interconnects 152.

Figure 15:
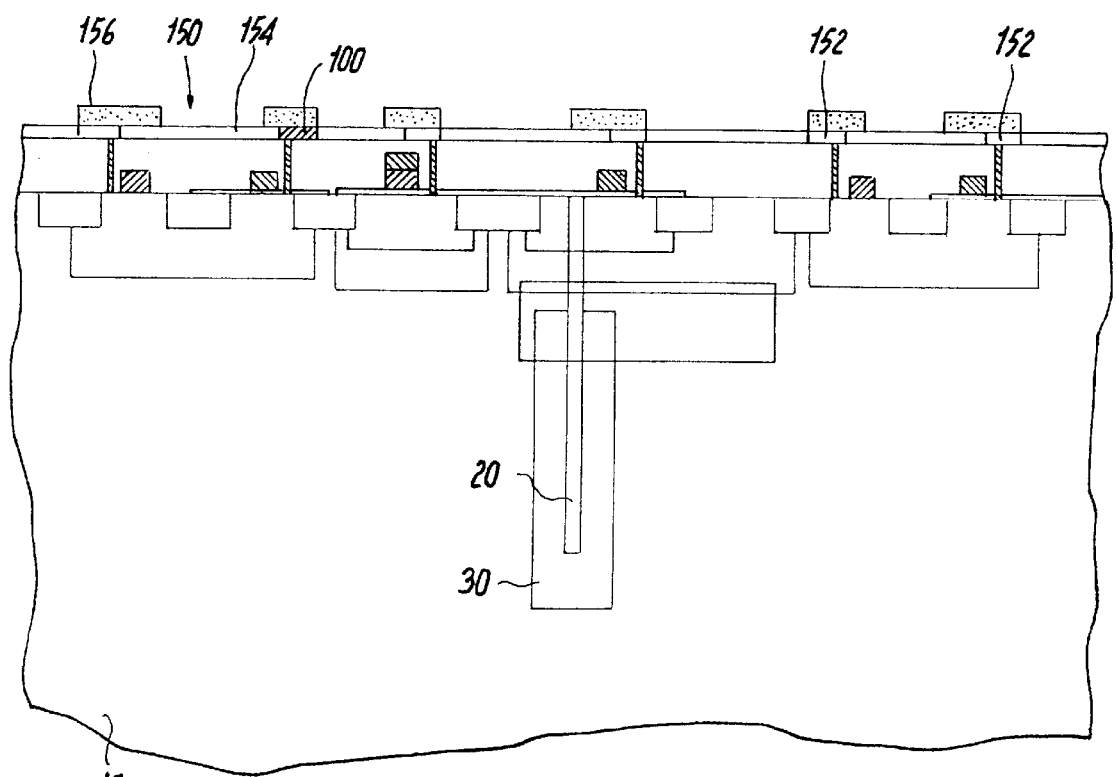

Referring to FIG. 15, a structure of an integrated chip 170 is shown. A conductive material, i.e. a metal, is deposited onto each of the local interconnects 152 and onto load element 100 to form interconnects 156. Each interconnect 156 is connected to the source drain junction of an associated one of the FETs. The connection of the interconnect 156 connected to source drain junction of the SRAM includes the load element 100. The interconnects 156 provide the capability of providing connections between the SRAM, DRAM, Flash memory and support devices on the chip.

Figure 16:
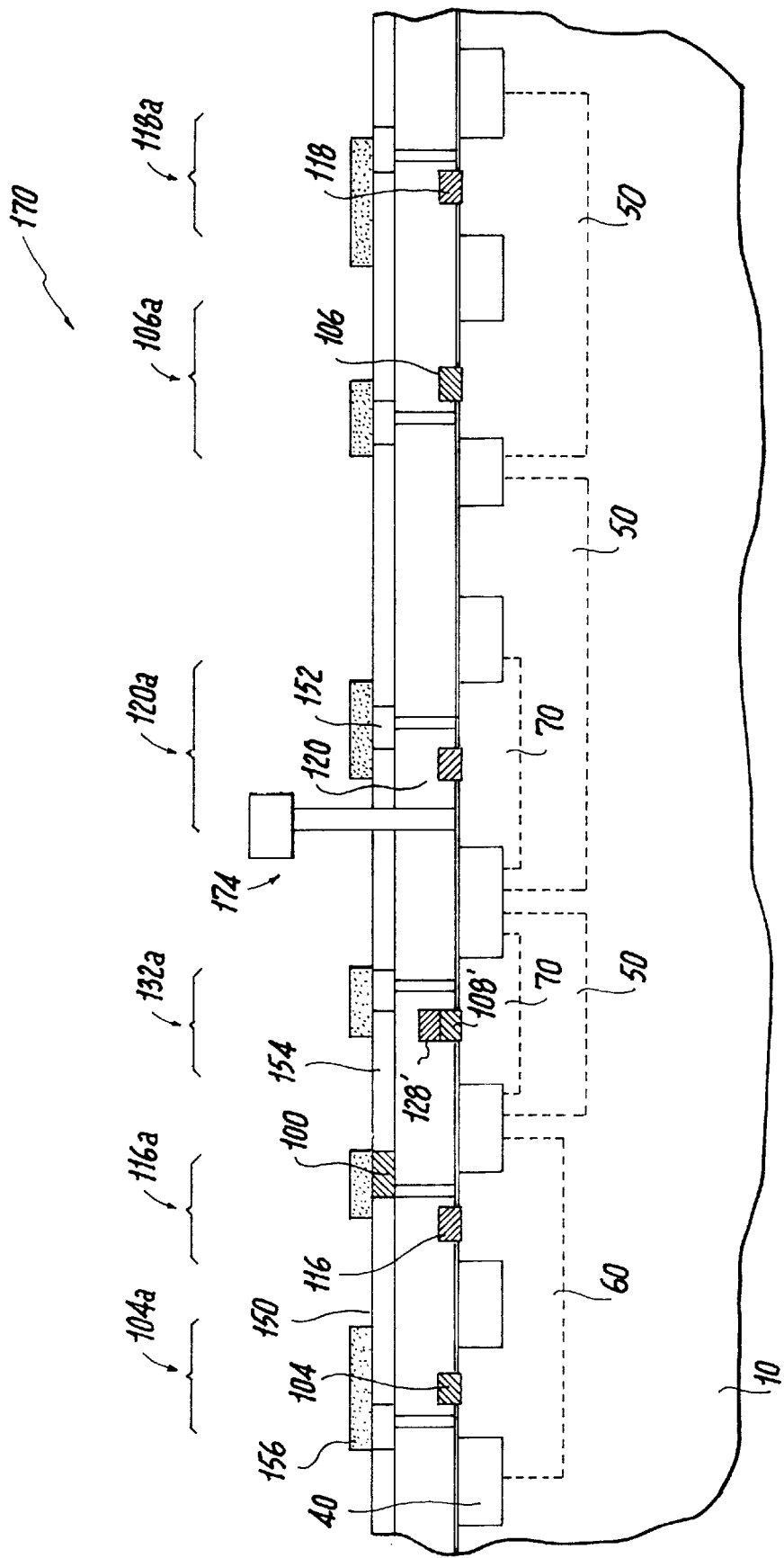
FIG. 16 is a cross-sectional view of an integrated chip in accordance with another embodiment of the present invention.

An alternate embodiment of the invention is shown in FIG. 16. In this embodiment a stacked capacitor 174 is provided for the DRAM nFET 120a, and the deep-trench capacitor 20, the n-band 80 and the n+ buried plate 30 are eliminated. In another embodiment, the SRAM of the integrated chip 170 shown in FIG. 15 is an 6T SRAM.

In use, it is contemplated that the DRAM of the integrated chip does not require refresh during a sleep or idle mode. In order to preserve data during sleep mode, the data is transferred from the DRAM to the Flash memory before entering the sleep mode and retrieved by the DRAM from the Flash memory after returning to an active mode.

It is further contemplated that updating of codes stored by Flash memory be performed by storing the new codes in the SRAM or the DRAM initially and updating the Flash memory in a hidden manner with the new codes, such as when a processing demand is low. Furthermore, the Flash memory can be updated using parallel normal DRAM operation without compromising overall system performance. It is further contemplated that SRAM be used as the interface between a processor and DRAM in high-speed cache operations.

What has been described herein is merely illustrative of the application of the principles of the present invention. Other arrangements and methods, such as using different substrates, may be implemented by those skilled in the art without departing from the scope and spirit of this invention.

What is claimed:

1. A method for fabricating a memory system comprising the steps of:

providing a single substrate;

fabricating at least one NVRAM cell on the single substrate;

fabricating at least one DRAM cell having a deep trench capacitor on the single substrate; and fabricating at least one SRAM cell on the single substrate.

2. The method according to claim 1, further comprising the step of forming at least one doped n-well region, at least one doped p-well region and at least one doped n-band region in the substrate.

3. The method according to claim 1, wherein the step of fabricating the at least one NVRAM cell comprises the step of forming a FET; wherein the step of fabricating the at least one SRAM cell comprises the step of forming a FET; and wherein the step of fabricating the at least one DRAM cell comprise the steps of:

forming a FET; and contacting the FET of the at least one DRAM cell with the deep trench capacitor.

4. The method according to claim 1, wherein the step of fabricating the at least one SRAM cell comprises the steps of:

providing a high resistive load element for the at least one SRAM cell;

connecting a FET of the at least one SRAM cell with the respective high resistive load element.

5. The method according to claim 4, wherein the step of connecting the FET of the at least one SRAM cell with the high resistive load element further comprises the step of forming a resistor inside a via and connecting the via to the FET of the at least one SRAM cell.

6. The method according to claim 1, further comprising the step of providing on the memory system a single voltage generator system for providing power to the at least one NVRAM cell, the at least one DRAM cell, and the at least one SRAM cell.

7. A method for fabricating a memory system comprising the steps of:

providing a single substrate;

fabricating at least one NVRAM cell on the single substrate;

fabricating at least one DRAM cell on the single substrate; and fabricating at least one SRAM cell having a high resistive load element on the single substrate.

8. The method according to claim 7, further comprising the step of forming at least one doped n-well region, at least one doped p-well region and at least one doped n-band region in the substrate.

9. The method according to claim 7, wherein the step of fabricating the at least one NVRAM cell comprises the step of forming a FET; wherein the step of fabricating the at least one DRAM cell comprises the step of forming a FET; and wherein the step of fabricating the at least one SRAM cell comprise the steps of:

forming a FET; and contacting the FET to the high resistive load element.

10. The method according to claim 7, wherein the step of fabricating the at least one DRAM cell comprises the steps of:

forming within the substrate a deep trench capacitor, forming a FET, and connecting the FET to the deep trench capacitor.

11. The method according to claim 10, wherein the step of connecting the FET of the at least one SRAM cell with the high resistive load element further comprises the step of forming a resistor inside a via and connecting the via to the of the at least one SRAM cell.

12. The method according to claim 7, further comprising the step of providing on the memory system a single voltage generator system for providing power to the at least one NVRAM cell, the at least one DRAM cell, and the at least one SRAM cell.

13. The method according to claim 9, wherein the step of fabricating the at least one DRAM cell comprises the steps of:

providing a stack capacitor on the substrate; and connecting the FET of the at least one DRAM cell with the stack capacitor.

* * * * *